April 29, 1969 R. J. ROCKWELL Re. 26,567
AMPLIFIER OF THE TRANSFORMER-OUTPUT TYPE WITH REGENERATIVE FEEDBACK NETWORKS FOR REDUCING LOW FREQUENCY DISTORTION
Original Filed June 29, 1964
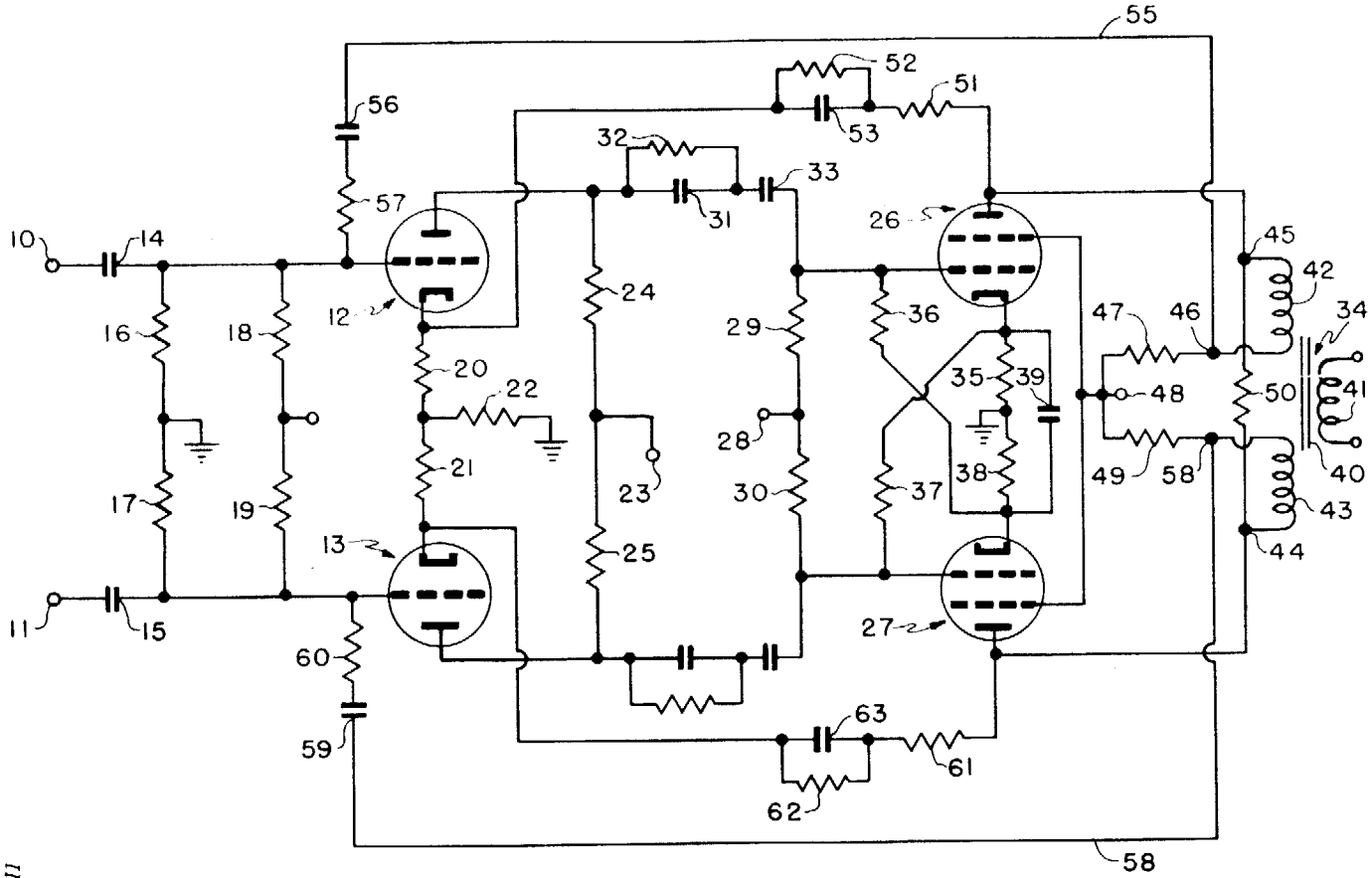
INVENTOR
RONALD J. ROCKWELL
BY
Charles M. Hogan
ATTORNEY United States Patent Office Re. 26,567
Reissued Apr. 29, 1969

26,567

AMPLIFIER OF THE TRANSFORMER-OUTPUT TYPE WITH REGENERATIVE FEEDBACK NETWORKS FOR REDUCING LOW FREQUENCY DISTORTION

Ronald J. Rockwell, Cincinnati, Ohio, assignor, by mesne assignments, to Avco Corporation, Cincinnati, Ohio, a corporation of Delaware Original No. 3,324,407, dated June 6, 1967, Ser. No. 378,782, June 29, 1964. Application for reissue Feb. 8, 1968, Ser. No. 706,200
Int. Cl. H03f *1/36, 3/28, 1/26*
U.S. Cl. 330—82 4 Claims

Matter enclosed in heavy brackets [ ] appears in the original patent but forms no part of this reissue specification; matter printed in italics indicates the additions made by reissue.

ABSTRACT OF THE DISCLOSURE

This is an amplifier which has push-pull driver tubes and push-pull output tubes. Low frequency response is improved by cross-couplings between the cathodes and grids of the output tubes. There is a negative feedback network between the anode of each output tube and the cathode of its associated driver tube. An iron core output transformer has two primary portions arranged in a series circuit between the anodes of the output tubes, which series circuit includes resistors separately connected between the space current source and these primary portions. Regenerative networks are connected between the junctions of these resistors with the primary portions and the control electrodes of the driver tubes so that the current is sampled in these primary portions and regeneratively fed back to the input of the system in order to decrease distortion at low frequencies.

The present invention relates to circuits for distortion reduction, particularly in vacuum tube or transistor amplifier circuits utilizing an iron core inductor. The invention is of utility in signal translating circuits employng an interstage iron core reactor, an interstage iron core transformer, an iron core output transformer, or an iron core induction effectively in shunt or in parallel.

The invention is directed to the problem which is raised by alternating current saturation at low frequencies, generally accompanied by slight direct current saturation. The effects of this saturation (i.e., distortion) are most detrimental at the maximum of the positive or negative excursions of the audio wave. As saturation increases, the input impedance of an output transformer, for example, decreases, which results in a current wave form of peaked configuration. That is, the maxima, which should approach the maxima of sine wave forms, become peaked. This signifies that the current is proportionally higher at the excursion peaks, due to non-linear iron saturation. This distortion of the current wave form causes a non-linear voltage drop at the output tube circuit and a non-linear voltage drop in the transformer primary, due to the primary resistance. That is, the effective voltage wave in the primary becomes flat-topped at the lower frequencies, causing distortion. At higher frequencies at which the iron does not saturate, the output voltage wave is sinusoidal.

An object of the invention is to provide, in a signal translating circuit of the type utilizing an iron core inductor, means for greatly reducing the distortion occasioned by the phenomenon just discussed. This object is realized by sampling the distorted peaked current wave in terms of peaked voltage across resistors in series with primary center taps and regeneratively inserting the peaked voltage sample, thus distorting the input voltage in an opposite sense to the flattened voltage distortion in the transformer secondary.

Another object of the invention is to provide the aforementioned means in combination with a negative feedback loop inside of the sampling loop.

For a better understanding of the invention, together with other objects, advantages, and capabilities thereof, reference is made to the following description of the appended drawing, in the single figure of which there is shown a high fidelity audio amplifier incorporating a novel combination of sampling and feedback loops in accordance with the invention.

A push-pull source of audio input signals, having a range between 20 and 20,000 cycles per second, is connected to the input terminals 10 and 11 and coupled to the control grid electrode or input circuits of a pair of driver triodes 12 and 13 via a network comprising series capacitor 14 (.05 μf.), series capacitor 15 (.05 μf.), a grounded center-tapped resistance comprising resistors 16 and 17 (each 100,000 ohms), and center-tapped shunt resistance comprising resistors 18 and 19 (each 135,000 ohms).

The driver triodes 12 and 13 are arranged in push-pull configuration with their respective separate cathode resistors 20 and 21 (1000 ohms each) in series with a common cathode resistor 22 (500 ohms). The anodes of the drivers 12 and 13 are connected to the positive terminal 23 of a source of plate voltage (approximately 450 volts) through anode load resistors 24 and 25 (each 51,000 ohms). A source of plate voltage is conventional and is sometimes referred to as a "source of space current." The driver triodes are coupled to output tubes 26 and 27 via coupling networks presently described. The control electrodes of the ouput tubes are connected to the negative terminal 28 of a common source of bias potential (—200 volts) via resistors 29 and 30 (each 680,000 ohms).

The couplings between the anode outputs of tubes 12 and 13 and the output tubes 26 and 27, respectively, are identical, and one will be described as representative. It comprises a parallel combination or low frequency step circuit consisting of capacitor 31 (.1 μf.) and resistor 32 (30,000 ohms), this combination being in series with the following elements: the anode of driver 12, blocking capacitor 33 (.5 μf.).

In order to improve the low frequency response of the system, a bias compensation circuit is associated with the power output tubes 26 and 27. This bias compensation circuit serves substantially to equalize the anode current of these two tubes. The bias compensating circuit consists of the resistors 36 and 37 (each 100,000 ohms), which are, respectively, connected to the control grids of the tubes 26 and 27 and, respectively, returned to the cathode of tube 27 and the cathode of tube 26. Thus, if tube 26 tends to draw more anode current, the higher cathode potential of tube 26 more positively biases the control grid of tube 27 through resistor 37, causing tube 27 to draw more anode current. But the relatively low cathode potential of tube 27 biases the control grid of tube 26 through resistor 36 less positively, which lowers the anode current of tube 26. In this manner the anode currents of the two tubes are substantially equalized. It should also be noted that the control electrodes of tubes 26 and 27 are maintained, via a connection to the negative terminal of a source of potential (—200 volts), at a normal negative voltage with respect to their cathodes. This arrangement provides excellent balancing of the anode currents even of unmatched tubes, thus clearly reducing the DC saturation of the output of transformer 34.

In order to make this compensating action more effective, the cathode resistors 35 and 38 of the output tubes are made approximately six times the normal cathode resistance for the particular tube type used (i.e., each is approximately 1800 ohms).

Excessive cathode degeneration, due to the high value cathode resistors 35 and 38, is eliminated by the use of capacitor 39 (500 μf.), which is connected between the cathodes of output tubes 26 and 27.

The output transformer 34 has an iron core 40, a secondary 41, and two primaries 42 and 43 wound in the same sense. The anode of output tube 27 is connected to a terminal 44 of primary 43. Similarly, the anode of output tube 26 is connected to a terminal 45 of primary 42. The remaining terminal 46 of primary 42 is connected via resistor 47 (560 ohms) to the positive terminal 48 of a high voltage source (465 volts). Resistor 49 (also 560 ohms) is similarly arranged. Between terminals 44 and 45 is connected a resistor 50 (10,000 ohms) in order to improve low frequency phase angle.

Particular attention is directed to the fact that the voltage across these resistors 47 and 49 is non-linear at low frequency, such as 20 cycles per second.

Attention is further invited to the fact that in this amplifier there are provided negative feedback networks between the anodes of the output tubes and the cathodes of their respective driver tubes. Since the two degenerative feedback networks are similar, one will be described as representative. Between the anode of output tube 26 and the cathode of driver tube 12 are connected, in series, resistor 51 (47,000 ohms) and a parallel combination or low frequency step circuit consisting of resistor 52 (220,000 ohms) and a capacitor 53 (.1 μf.).

The undesired wave shape distortion caused by alternating current saturation at low frequencies is very materially reduced in accordance with the present invention by sampling the primary current in primary 42, similarly sampling the current in primary 43, and applying the samples to the inputs of tubes 12 and 13, respectively. The sampling resistors 47 and 49 are provided in series between their respectively associated primaries and high voltage terminal 48. The junction 46 of primary 42 and resistor 47 is coupled to the input or control electrode circuit of tube 12 via a series arrangement comprising conductor 55, capacitor 56 (.05 μf.) and resistor 57 (480,000 ohms). A like regenerative feedback network comprising conductor 58, capacitor 59 (.05 μf.) and resistor 60 (480,000 ohms) is provided. It will be noted that samples are inserted into the signal translating circuitry ahead of the negative feedback loops, one of which comprises the elements 51–53, and the other of which comprises the elements 61–63.

The effect of the regenerative coupling networks is such that the over-all inputs to the tubes 12 and 13 at low frequencies are voltage waves, the maxima of which are peaked. The peak wave forms are amplified in the first stage of the amplifier comprising tubes 12 and 13 and the second stage of the amplifier comprising tubes 26 and 27, and the resultant amplified and distored wave forms appearing at the outputs of the tubes 26 and 27 are distorted in a manner compensatory of the additonal distortion introduced by the iron core primary of output transformer 34.

It has been found experimentally that an amplifier containing the illustrative parameters herein mentioned suffers from less than .2% distortion from 20 cycles per second to 20,000 cycles per second, and is flat within .1 decibel over this range.

While there has been shown and described what is at present considered to be the preferred embodiment of the invention, it will be apparent to those skilled in the art that various modifications and changes may be made therein without departing from the proper scope of the invention. For example, all parameters herein mentioned are intended to be illustrative and are not offered as limitations on the invention.

Having disclosed my invention, I claim:

1. In an amplifier, the combination of:

a push-pull driver stage comprising first and second driver tubes each having a control electrode and an anode and a cathode, the control electrode and cathode of the first driver tube constituting its input and the control electrode and cathode of the second driver tube constituting the input of the second driver tube, a push-pull output stage comprising first and second output tubes each having a control electrode and an anode and a cathode and each being coupled to a driver tube, a first resistor for cross-connecting the control electrode of the first output tube to the cathode of the second output tube, a second resistor for cross-connecting the control electrode of the second output tube to the cathode of the first output tube, a negative feedback network between the anode of the first output tube and the cathode of the first driver tube, another negative feedback network between the anode of the second output tube and the cathode of the second driver tube, an output transformer having an iron core inductor and first and second primary portions having terminals connected to the anodes of the first and second output tubes, respectively, said portions also having second terminals, a first regenerative network for sampling the current in said first primary portion and applying it to the input of the first driver tube, and a second regenerative network for sampling the current in said second primary portion and applying it to the input of said second driver tube, the regenerative networks being individually connected between said second terminals and the control electrodes of the associated driver tubes.

2. The combination in accordance with claim 1, a source of space current, and third and fourth resistors individually connected in series with said primary portions and said source, said regenerative networks originating at the connections between said primary portions and their associated resistors.

*3. In an alternating current amplifier, the combination of:*

*a push-pull driver to which sinusoidal audio waves are applied, said driver comprising at least two active elements and having two pairs of inputs,*

*a push-pull output stage comprising two additional active elements each having an input coupled to an active element of the driver and also an output,*

*an output transformer having a primary and an iron core and coupled to the outputs of the output stage, said primary being normally susceptible to an approach to magnetic saturation which becomes more detrimental at the maxima of the positive and negative current excursions of low frequency audio waves,*

*a negative feedback network between the output of one of the additional active elements and one of the inputs of the driver,*

*another negative feedback network between the output of the other additional active element and another input of the driver,*

*and means for counterdistorting the input signals of said driver to overcome the deleterious effects of the distortion normally caused by said approach to saturation comprising:*

*a first means for obtaining a voltage constituting a representative sample of the audio current in that portion of the primary of said transformer which is coupled to the output of said one of the additional active elements, which current is caused to peak as saturation is approached,*

*a second means for obtaining a voltage constituting a representative sample of the audio current*

*in that portion of the primary of said transformer which is coupled to the other additional active element, which current is also caused to peak as saturation is approached,*

*a first positive feedback means for regeneratively applying the first-mentioned sample to another input of the driver, and*

*a second positive feedback means for regeneratively applying the second-mentioned sample to the remaining input of the driver,*

*so that the application of the positive feedback in each case precedes the application of the negative feedback, whereby the counterdistortion is not impaired by the negative feedback,*

*the inputs of the driver to which positive feedback is applied being in advance of the inputs to which negative feedback is applied.*

*4. In an alternating current amplifier, the combination of:*

*a driver, to which sinusoidal waves are applied, said driver comprising at least one active element and having two inputs,*

*an output stage comprising an active element and an input and an output,*

*resistance-capacitance means for coupling the driver to the input of the output stage,*

*an output transformer having a primary and an iron core and coupled to said output, said primary being normally susceptible to an approach to magnetic saturation, which becomes more detrimental at the maxima of the positive and negative excursions of low frequency audio waves,*

*negative feedback means between the output of the active element and one of the driver inputs,*

*and means for counterdistorting the input signals to said driver to overcome the deleterious effects of the distortion of the output normally caused by said approach to saturation comprising:*

*means for obtaining a voltage constituting a representative sample of the audio current in the primary of said transformer, which current is caused to peak as saturation is approached, and*

*positive feedback means comprising a resistance-capacitance network for regeneratively applying said current sample to the other driver input, the driver input to which positive feedback is applied being in advance of the driver input to which negative feedback is applied so that the counterdistortion is not impaired by the negative feedback.*

References Cited

The following references, cited by the Examiner, are of record in the patented file of this patent or the original patent.

UNITED STATES PATENTS

| | | | |
|---|---|---|---|
| 2,581,953 | 1/1952 | Hecht et al. | 330—82 |
| 1,955,827 | 4/1934 | Peterson | 330—100 X |
| 2,270,295 | 1/1942 | Harley | 330—82 |
| 2,272,235 | 2/1942 | Boucke | 330—104 |
| 2,305,893 | 12/1942 | Oman | 330—104 |
| 2,509,389 | 5/1950 | Blake | 330—149 X |
| 2,529,459 | 11/1950 | Pourciau et al. | 330—100 X |
| 2,581,953 | 1/1952 | Hecht et al. | 330—82 |
| 2,777,905 | 1/1957 | Kelly | 330—82 |
| 2,817,718 | 12/1957 | Rockwell | 330—82 X |
| 3,111,630 | 11/1963 | Wolcott | 330—104 X |

ROY LAKE, *Primary Examiner.*

J. B. MULLINS, *Assistant Examiner.*

U.S. Cl. X.R.

330—100, 102, 104, 105, 149